United States Patent [19]

Shimizu et al.

[11] Patent Number: 5,235,209
[45] Date of Patent: Aug. 10, 1993

[54] MULTI-LAYER LEAD FRAME FOR A SEMICONDUCTOR DEVICE WITH CONTACT GEOMETRY

[75] Inventors: Mitsuharu Shimizu; Yoshiki Takeda; Hirofumi Fujii, all of Nagano, Japan

[73] Assignees: Shinko Electric Industries Co., Ltd., Nagano, Japan; Intel Corp., Santa Clara, Calif.

[21] Appl. No.: 753,794

[22] Filed: Sep. 3, 1991

[30] Foreign Application Priority Data

Sep. 4, 1990 [JP] Japan .................... 2-235067

[51] Int. Cl.⁵ ............................. H01L 23/48
[52] U.S. Cl. ........................ 257/692; 257/693; 257/709; 257/700
[58] Field of Search ............ 357/70, 71; 257/700, 257/709, 710, 692, 693, 698, 699, 773, 783

[56] References Cited

U.S. PATENT DOCUMENTS 5,032,895 7/1991 Horiuchi et al. ............... 357/70
5,105,257 4/1992 Michii ........................ 357/71

Primary Examiner—William Mintel
Assistant Examiner—Roy Potter
Attorney, Agent, or Firm—Michael N. Meller

[57] ABSTRACT

A multi-layer lead frame for a semiconductor device comprises a lead frame body made of a metal strip having a first opening and a plurality of inner leads having respective innertips which define the opening. A metal plane independent from the lead frame body and adhered to the inner leads by an insulation adhesive film, has an inner periphery defining a second opening corresponding to the first opening. The inner periphery of the insulation film protrudes slightly from the inner tips of the inner leads.

10 Claims, 3 Drawing Sheets

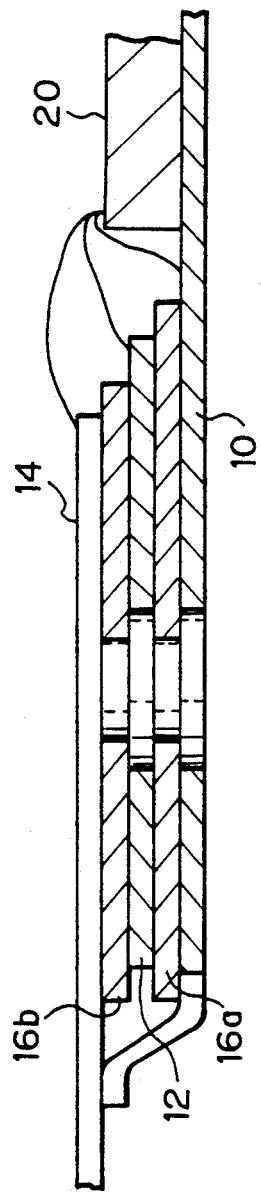
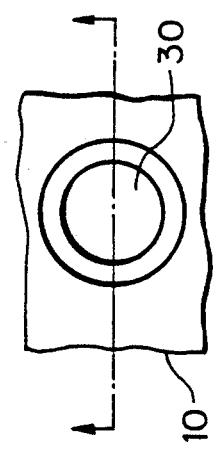
Fig. 4A
Fig. 4B

MULTI-LAYER LEAD FRAME FOR A SEMICONDUCTOR DEVICE WITH CONTACT GEOMETRY

BACKGROUND OF THE INVENTION

1. Field of the Invention

This invention relates to a lead frame, and particularly, to a multi-layer lead frame having at least one metal plate or plane, hereinafter referred to as "metal plane", used for a semiconductor device.

2. Description of the Related Art

A conventionally known multi-layer lead frame for a semiconductor device comprises at least one metal plane connected via an insulative layer to the bottom surfaces of inner leads, and the use of such a multi-layer lead frame enables the mounting of a relatively power-consumable semiconductor chip on the metal plane, due to a heat radiation of the metal plane. Also, the metal plane can be used as a ground layer or a power supply layer, to thereby improve the electrical characteristics of the semiconductor device.

FIG. 3 shows a conventionally known multi-layer lead frame which includes a ground metal plane 10, a power supply metal plane 12 and a plurality of inner leads 14, which are affixed or laminated to each other, in turn, by electrically insulation films 16a and 16b respectively, made of, for example, polyimide.

The ground plane 10 is also used as a stage for mounting thereon a semiconductor chip (not shown). The power supply plane 12 has a frame-like shape for embracing the semiconductor chip mounting stage, and the inner leads 14 are arranged around the power supply plane 12. Inner tips of the inner leads 14 are arranged so as to be retracted from the front edges of the power supply plane 12, to thus ensure wire-bonding areas for a wire-bonding connection between the semiconductor chip and the exposed surface of the power supply plane 12.

Also, the ground plane 10 and the power supply plane 12 have respective projections 31 (FIG. 5A) protrudind from the outer edges thereof, for an electrical connection thereof to the ground leads and the power supply leads, respectively, among the plurality of inner leads 14.

In the above-mentioned conventional multi-layer lead frame, the dimensions of the outer and inner edges of the insulation film 16a and the inner edge of the insulation film 16b are the same as those of the outer and inner edges of the ground plane 10 and the inner edge of the power supply plane 12, respectively. Consequently, when the ground plane 10 and the power supply plane 12 are abutted against each other, an insulation film having exactly the same dimensions as the power supply plane 12 should be used.

The inner leads 14 and the metal planes used for a multi-layer lead frame can be made not only by an etching process but also by a punching process, which is more suitable for mass-production. Nevertheless, when producing these elements by the punching process, burrs or flashing may be generated, which may cause an electrical short circuit between the inner leads 14 and the metal planes, i.e., between the metal layers.

FIGS. 2A and 2B show burrs or flashing of the inner lead 14. First, when stamping to make the inner leads, extending in the vertical direction may be generated burrs or flashing 18a, as shown in FIG. 2A. Then, if the inner leads are placed under a pressure, for example, when they are transported, burrs or flashing 18b extending in the transverse direction may be generated, as shown in FIG. 2B.

In the prior art, since an insulation film having substantially the same dimensions as the metal planes is used to adhered these planes to each other, the position thereof may become misaligned by about 75 $\mu$m at maximum. Therefore, if the above-mentioned burrs or flashes are generated and if the positions of the metal planes are not aligned with respect to the insulating film, an electrical short circuit may occur due to a mechanical contact between the metal layers.

Further, to improve the electrical characteristic of the lead frame, a matching of the characteristic impedance has recently been required, and to effect this matching of the characteristic impedance, the thickness of the insulation film shall be reduced. In this case, an electrical short circuit still may easily occur between the metal layers, due to burrs or flashing produced by stamping.

Also, to improve the wire-bonding characteristic, the wire-bonding areas of the inner leads and the metal planes are frequently coated with a film of silver. This solution, however, has a problem in that the electrical insulation characteristic between the metal layers becomes lower due to a silver-migration, and if the thickness of the insulation film is reduced so that the distance between the metal layers becomes shorter, an electrical short circuit still may easily occur between the metal layers, due to this silver-migration.

SUMMARY OF THE INVENTION

An object of the present invention is to provide a multi-layer lead frame used for a semiconductor device, wherein the electrical insulation between metal layers is effectively improved even if such metal layers are formed by a stamping process or the like, or even if a very thin insulation film is used.

According to this invention, there is provided a multi-layer lead frame for a semiconductor device comprising: a lead frame body made of a metal strip having a first opening and a plurality of inner leads, the inner leads having respective inner tips which define at least a part of the opening; at least one metal plane, which is independent from the lead frame body, and is adhered to the inner leads by an insulation adhesive film; the insulation adhesive film having an inner periphery defining a second opening corresponding to the first opening; and the inner periphery of the insulation film slightly protruding from the inner tips of the inner leads.

In another aspect of the present invention, there is provided a multi-layer lead frame for a semiconductor device comprising: a lead frame body made of a metal strip having a first opening and a plurality of inner leads, the inner leads having respective inner tips which define at least a part of the opening; a power supply metal plane independent from the lead frame body and adhered to the inner leads by a first insulation adhesive film, the power supply metal plane having a second opening corresponding to but smaller than the first opening; a ground metal plane, also independent from the lead frame body and from the power supply metal plane, and adhered to the power supply metal plane by a second insulation adhesive film; the first insulation adhesive film having an inner periphery defining a third opening corresponding to the first opening of the inner leads, the inner periphery of the first insulation film slightly protruding from the inner tips of the inner leads; and the second insulation adhesive film having an inner periphery defining a fourth opening corresponding to the second opening of the power supply plane, the inner periphery of the second insulation film slightly protruding from the inner tips of the power supplying plane. The outer dimension of the insulation film may be slightly larger than the outer dimension of the power supply plane, and the dimension of the inner periphery of the rectangular frame-shaped insulation film may be slightly smaller then the dimension of the inner periphery of the power supply plane.

BRIEF DESCRIPTION OF THE DRAWINGS

FIGS. 4A and 4B are partial cross-sectional and bottom views of an embodiment of the multi-layer lead frame according to this invention.

DESCRIPTION OF THE PREFERRED EMBODIMENTS

Figure 1:
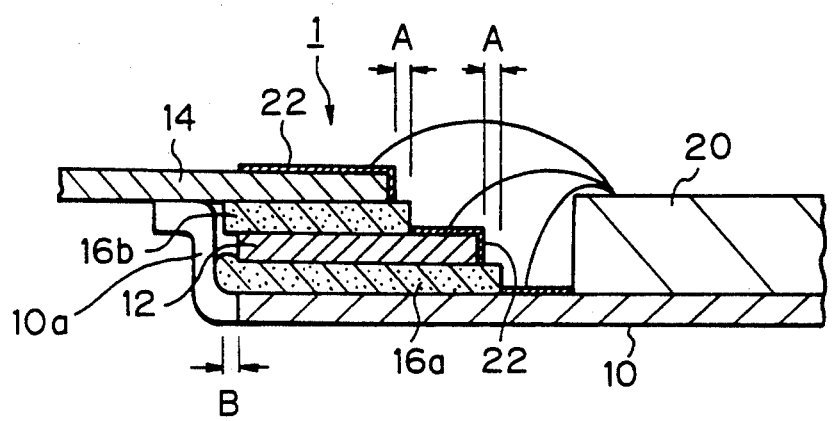
FIG. 1 is a cross-sectional view of a semiconductor device having a chip mounted on a multi-layer lead frame according to this invention.
Figure 2A:
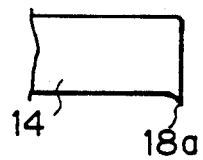
FIGS. 2A and 2B show burrs or flashing of the inner lead.
Figure 2B:
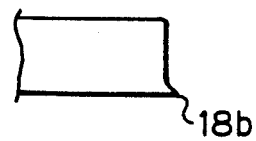

Referring now to FIG. 1, which shows a preferred embodiment of a multi-layer lead frame used in a semiconductor device according to the present invention, a multi-layer lead frame of this embodiment is generally indicated by a reference numeral 1 and comprises a ground metal plane 10, a power supply metal plane 12 fixed to the ground metal plane 10 via an electrically insulation film 16a, and inner leads 14 fixed to the power supply metal plane 12 via another insulation film 16b. The adhesive insulation films 16a and 16b are made of, for example, polyimide. A semiconductor chip 20 is fixed to and mounted on the ground metal plane 10.

Figure 3:
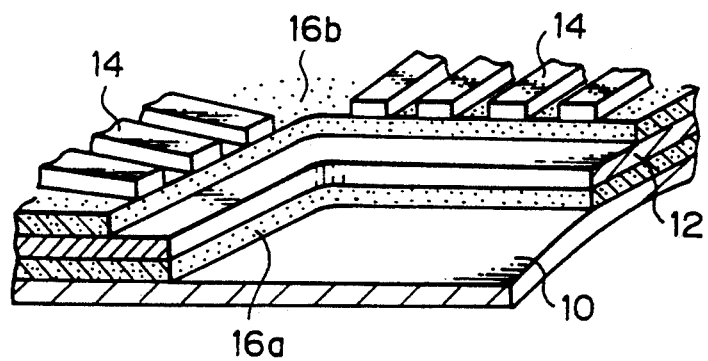
FIG. 3 is a partial perspective view of a conventionally known multi-layer lead frame.

The power supply plane 12 has a rectangular-frame shape and, therefore, has a rectangular opening 12a (FIG. 3) at a central portion thereof defining a stage portion on the ground metal plane 10, on which a semiconductor chip 20 is mounted. Also, the insulation film 16a has a rectangular-frame shape and fixes the power supply plane 12 to the ground plane 10. The outer dimension of the insulation film 16a is slightly larger than the outer dimension of the power supply plane 12, and the dimension of the inner periphery of the rectangular frame-shaped insulation film 16a is slightly smaller than the dimension of the inner periphery of the power supply plane 12. Therefore, the inner periphery of the insulation film 16a protrudes slightly inward from the inner periphery of the power supply plane 12, and the outer periphery of the insulation film 16a protrudes slight outward from the outer peripheral edge of the power supply plane 12.

In the same manner as above, the insulation film 16b located between the power supply plane 12 and the inner leads 14 has a rectangular frame-shape having a dimension such that the inner periphery of the insulation film 16b protrudes slightly inward from the front ends of the inner leads 14.

In FIG. 1, "A" indicates a length by which the insulation films 16a and 16b protrude inward from the inner periphery of the power supply plane 12 and from the front ends of the inner leads 14, respectively. Also, "B" indicates a length by which the insulation films 16a and 16b protrude outward from the outer peripheral edge of the power supply plane 12. In this embodiment, "A" or "B" is set as 1.0 mm. Namely, considering that a maximum tolerance of positional errors when the metal planes and inner leads are laminated with the insulation films is about 0.75 μm, the length of the burrs or flashing of the inner leads 14 when being stamped is about 0.25 μm, and further, taking into account the hermetic sealing with resin, preferably the length by which the insulation films 16a and 16b protrude is about 1.0 mm.

According to the present invention, as the inner peripheries of the insulation films 16a and 16b protrude inward, even if stamping burrs or flashing exists, they are covered by the protruding portions of the insulation films 16a and 16b. Therefore, an electrical contact or short circuit between the metal layers can be prevented, even if the insulation films 16a and 16b are very thin.

Further, in this embodiment, the wire-bonding areas on the ground plane 10, the power supply plane 12 and the inner leads 14 are coated with layers of silver. In this invention, since the insulation films 16a and 16b protrude inward, as mentioned above, the volume of the insulation area between the metal planes is increased and, therefore, a reduction of the electrical insulation due to a silver-migration is effectively prevented.

In the above embodiment, each of the insulation films 16a and 16b has a large width and protrudes both inward and outward, but the insulation films 16a and 16b can be formed so as to protrude only inward, to thereby avoiding the influence of a silver-migration or the like. The advantage obtained by allowing the insulation films 16a and 16b to protrude outward is that, when the extensions (at 10a) projecting outward from the outer peripheral edges of the power supply plane 12 or the ground plane 10 are connected to the power supply leads or ground leads among the inner leads, the extensions are prevented from coming into contact with the outer peripheral edge of the intermediate metal plane, such as the power supply plane 12, and thus avoids an electrical short circuit between the metal planes when the power supply plane 12 or the inner leads are fixed to each other.

Although, in the above embodiment, the multi-layer lead frame is made by stamping, the present invention also can be applicable to a lead frame made by etching, since this also has the same problems of a silver-migration when the insulation film is very thin, positioning errors when laminating, and an electrical short circuit between the projections.

Also, the multi-layer lead frame in the above embodiment comprises a ground plane 10, power supply plane 12 and inner leads, and are laminated in this order. Such an order of lamination and number of laminated planes is not always necessary and does not limit the above embodiment.

Although preferred embodiments and modifications of this invention have been described above with reference to the drawings, it should be understood that the scope of this invention is not limited to such embodiments or modifications, and that other modifications can be made by a person skilled in the art within the scope or spirit of this invention as claimed in the attached claims.

Figure 5A:
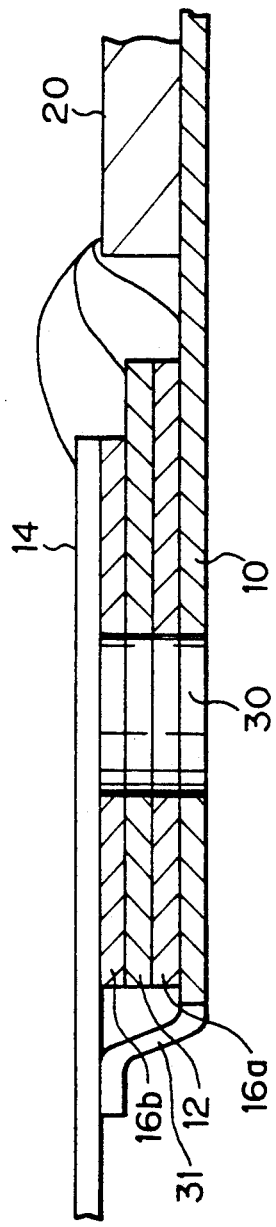
FIGS. 5A and 5B are partial cross-sectional and bottom views of a conventionally known multi-layer lead frame.
Figure 5B:
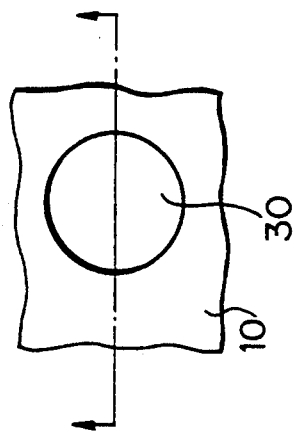

FIGS. 4A and 4B show an embodiment of the multi-layer lead frame according to the present invention and having a plurality of through holes 30, only one of which is illustrated. Each hole 30 passes through the ground plane 10, the insulation film 16a, the power supply plane 12, and the insulation film 16b. According to the present invention, the diameter of holes in the insulation films 16a and 16b is smaller than that of holes in the metal planes 10 and 12. Therefore, the insulation film 16a can be seen from the bottom, as shown in FIG. 4B. In the prior art, however, the diameter of holes in the insulation films is the same as that of holes in the metal planes 10 and 12 and, therefore, the insulation film cannot be seen from the bottom, as shown in FIG. 5A and 5B.

We claim:

1. A multi-layer lead frame for a semiconductor device comprising:
   a lead frame body made of a metal strip having a first opening and a plurality of inner leads, said inner leads having respective inner tips which define at least a part of said opening, at least one of said inner leads functions as a ground lead;
   a power supply metal plane, independent from said lead frame body and adhered to said inner leads by a first insulation adhesive film, said power supply metal plane having a second opening corresponding to, but smaller than, said first opening;
   a ground metal plane, also independent from said lead frame body and from said power supply metal plane, and adhered to said power supply metal plane by a second insulation adhesive film;
   said first insulation adhesive film having an inner periphery defining a third opening corresponding to said first opening of said inner leads, said inner periphery of said first insulation film protruding slightly from said inner tips of said inner leads;
   said second insulation adhesive film having an inner periphery defining a fourth opening corresponding to said second opening at said power supply plane, said inner periphery of said second insulation film protruding slightly from said inner tips of said power supply plane;
   said first and second insulation adhesive films and said power supply and ground planes having respective outer peripheries;
   said ground plane having at least one extension projecting outward from said outer periphery thereof, said extension being connected to said ground lead; and
   said outer periphery of said second insulation adhesive film protruding slightly outward from said outer periphery of said ground plane and from said outer periphery of said power supply plane so that said extension being prevented from coming into contact with said outer periphery of said power supply plane.

2. A multi-layer lead frame as set forth in claim 1, wherein said inner periphery of each of said first and second insulation film protrudes inward by 1.0 mm or less from said inner tips of the inner leads and said inner periphery of the power supply plane, respectively.

3. A multi-layer lead frame as set forth in claim 1, wherein said first through fourth openings are covered with said ground metal, to thereby define a die-pad stage area on which a semiconductor chip is to be mounted.

4. A multi-layer lead frame as set forth in claim 1, wherein said outer periphery of said first insulation adhesive film protrudes slightly outward from said outer periphery of said power supply plane.

5. A multi-layer lead frame as set forth in claim 1, wherein said outer periphery of said second insulation film protrudes outward by 1.0 mm or less from said outer periphery of said ground plane.

6. A multi-layer lead frame as set forth in claim 1, wherein said lead frame has at least one through hole passing through said first insulation film, said power supply plane, said second insulation film, and said ground plane, and a diameter of said through hole in the first and second insulation films is smaller than that of said through hole in the power supply and ground planes.

7. A multi-layer lead frame as set forth in claim 6, wherein the diameter of the through hole of the first and second insulation films is smaller by 2.0 mm or less than that of the through hole in the power supply and ground planes.

8. A multi-layer lead frame for a semiconductor device comprising:
   a lead frame body made of a metal strip having a first opening and a plurality of inner leads, said inner leads having respective inner tips which define at least a part of said opening;
   an intermediate metal plane, independent from said lead frame body and adhered to said inner leads by a first insulation adhesive film, said intermediate plane having a second opening corresponding to, but smaller than, said first opening;
   a lower metal plane, also independent from said lead frame body and from said intermediate plane, and adhered to said intermediate plane by a second insulation adhesive film;
   said first insulation adhesive film having an inner periphery defining a third opening corresponding to said first opening of said inner leads, said inner periphery of said first insulation film protruding slightly from said inner tips of said inner leads;
   said second insulation adhesive film having an inner periphery defining a fourth opening corresponding to said second opening of said intermediate plane, said inner periphery of said second insulation film protruding slightly from said inner tips of said intermediate plane;
   said first and second insulation adhesive films and said intermediate and lower planes having respective outer peripheries;
   said lower plane having at least one extension projecting outward from said outer periphery thereof, said extension is connected to at least one of said inner leads; and
   said outer periphery of said second insulation adhesive film protruding slightly outward from said outer periphery of said lower plane and from said outer periphery of said intermediate plane so that said extension is prevented from coming into contact with said outer periphery of said intermediate plane.

9. A multi-layer lead frame for a semiconductor device comprising:
   a lead frame body made of a metal strip having a first opening and a plurality of inner leads, said inner leads having respective inner tips which define at least a part of said opening, at least one of said inner leads functions as a ground lead;
   a power supply metal plane, independent from said lead frame body and adhered to said inner leads by a first insulation adhesive film, said power supply metal plane having a second opening corresponding to, but smaller than, said first opening;

a ground metal plane, also independent from said lead frame body and from said power supply metal plane, and adhered to said power supply metal plane by a second insulation adhesive film;

said first and second insulation adhesive films and said power supply and ground planes having respective outer peripheries;

said ground plane having at least one extension projecting outward from said outer periphery thereof, said extension being connected to said ground lead; and said outer periphery of said second insulation adhesive film protruding slightly outward from said outer periphery of said ground plane and from said outer periphery of said power supply plane so that said extension is prevented from coming into contact with said outer periphery of an intermediate plane, said power supply plane.

10. A multi-layer lead frame for a semiconductor device comprising:

a lead frame body made of a metal strip having a first opening and a plurality of inner leads, said inner leads having respective inner tips which define at least a part of said opening;

an intermediate metal plane, independent from said lead frame body and adhered to said inner leads by a first insulation adhesive film, said intermediate plane having a second opening corresponding to, but smaller than, said first opening;

a lower metal plane, also independent from said lead frame body and from said intermediate plane, and adhered to said intermediate plane by a second insulation adhesive film;

said first and second insulation adhesive films and said intermediate and lower planes having respective outer peripheries;

said lower plane having at least one extension projecting outward from said outer periphery thereof, said extension is connected to at least one of said inner leads; and said outer periphery of said second insulation adhesive film protruding slightly outward from said outer periphery of said lower plane and from said outer periphery of said intermediate plane so that said extension is prevented from coming into contact with said outer periphery of said intermediate plane.

* * * * *